United States Patent
Parks

(10) Patent No.: US 8,479,374 B2
(45) Date of Patent: Jul. 9, 2013

(54) METHOD OF PRODUCING AN IMAGE SENSOR HAVING MULTIPLE OUTPUT CHANNELS

(75) Inventor: Christopher Parks, Rochester, NY (US)

(73) Assignee: Truesense Imaging, Inc., Rochester, NY (US)

( * ) Notice: Subject to any disclaimer, the term of this patent is extended or adjusted under 35 U.S.C. 154(b) by 58 days.

(21) Appl. No.: 12/967,341

(22) Filed: Dec. 14, 2010

(65) Prior Publication Data

US 2012/0144656 A1 Jun. 14, 2012

(51) Int. Cl.
*H01S 4/00* (2006.01)

(52) U.S. Cl.
USPC ............. 29/592.1; 29/825; 348/311; 348/315

(58) Field of Classification Search
USPC ............................ 29/592.1, 825; 348/311, 315
See application file for complete search history.

(56) References Cited

U.S. PATENT DOCUMENTS

| | | | |
|---|---|---|---|
| 3,806,772 A | 4/1974 | Early | |
| 4,309,624 A | 1/1982 | Hynecek et al. | |
| 5,086,344 A | 2/1992 | D'Luna et al. | |
| 5,250,824 A | 10/1993 | Janesick | |
| 5,337,340 A | 8/1994 | Hynecek | |
| 5,784,412 A | 7/1998 | Ichihara | |
| 6,128,039 A * | 10/2000 | Chen et al. ................... | 348/294 |
| 6,444,968 B1 | 9/2002 | Burt et al. | |
| 6,862,333 B2 | 3/2005 | Kashima et al. | |
| 7,139,023 B2 * | 11/2006 | Hynecek ...................... | 348/303 |
| 7,190,400 B2 * | 3/2007 | Hynecek ...................... | 348/317 |
| 7,291,821 B2 | 11/2007 | Robbins | |
| 7,420,605 B2 | 9/2008 | Pool et al. | |
| 7,460,164 B2 * | 12/2008 | Hyama et al. ................. | 348/300 |
| 7,522,205 B2 * | 4/2009 | Parks ............................ | 348/311 |
| 7,619,201 B2 | 11/2009 | Hadfield | |
| 7,679,665 B2 * | 3/2010 | Egawa et al. ................. | 348/305 |
| 7,755,688 B2 * | 7/2010 | Hatano et al. ................. | 348/300 |
| 7,893,978 B2 * | 2/2011 | Hiyama et al. ................ | 348/300 |
| 7,961,237 B2 * | 6/2011 | Hatano et al. ................. | 348/300 |
| 7,973,847 B2 * | 7/2011 | Beck et al. .................... | 348/308 |
| 7,990,452 B2 * | 8/2011 | Yan .............................. | 348/300 |

(Continued)

FOREIGN PATENT DOCUMENTS

| | | |
|---|---|---|
| EP | 1 081 766 | 3/2001 |
| EP | 866 501 | 12/2004 |
| WO | WO-2010/087288 | 8/2010 |

OTHER PUBLICATIONS

International Search Report and Written Opinion mailed Feb. 14, 2012 for International Application No. PCT/US2011/064527 (10 pages).

*Primary Examiner* — Carl Arbes
(74) *Attorney, Agent, or Firm* — Howard & Howard Attorneys PLLC

(57) ABSTRACT

A method for producing an image sensor includes providing a horizontal shift register electrically connected to a pixel array for receiving charge packets from the pixel array. A non-destructive sense node is provided that is connected to an output of the horizontal shift register. A charge directing switch is provided that is electrically connected to the non-destructive sense node. The charge directing switch includes first and second outputs. A charge multiplying horizontal shift register is provided that is electrically connected to the first output of the charge directing switch. A bypass horizontal shift register or an amplifier is provided that is connected to the second output of the charge directing switch.

10 Claims, 8 Drawing Sheets

U.S. PATENT DOCUMENTS

| | | |
|---|---|---|
| 7,995,113 B2 * | 8/2011 | Karim et al. ............... 348/229.1 |
| 2002/0191093 A1 * | 12/2002 | Hynecek ....................... 348/311 |
| 2006/0231738 A1 | 10/2006 | Robbins |
| 2007/0146521 A1 | 6/2007 | Robbins |
| 2007/0214200 A1 | 9/2007 | Hazelwood |
| 2007/0242145 A1 | 10/2007 | Hazelwood et al. |
| 2008/0239129 A1 * | 10/2008 | Oshima et al. ................ 348/311 |
| 2009/0231456 A1 | 9/2009 | Robbins |
| 2011/0273603 A1 * | 11/2011 | Suzuki et al. ................. 348/311 |

* cited by examiner

METHOD OF PRODUCING AN IMAGE SENSOR HAVING MULTIPLE OUTPUT CHANNELS

CROSS-REFERENCE TO RELATED APPLICATIONS

This application is related to U.S. patent application Ser. No. 12/967,428, U.S. patent application Ser. No. 12/967,299, U.S. patent application Ser. No. 12/967,311, and U.S. patent application Ser. No. 12/967,326, all filed on Dec. 14, 2010, and to U.S. patent application Ser. No. 12/973,090, U.S. patent application Ser. No. 12/973,108, and U.S. patent application Ser. No. 12/973,134 all filed on Dec. 20, 2010.

TECHNICAL FIELD

The present invention relates to image sensors for use in digital cameras and other types of image capture devices, and more particularly to Charge Coupled Device (CCD) image sensors. Still more particularly, the present invention relates to a method of producing a CCD image sensor having multiple output channels.

BACKGROUND

FIG. 1 depicts a simplified block diagram of a first CCD image sensor that performs charge multiplication in accordance with the prior art. Pixel array 100 includes vertical charge-coupled device (CCD) shift registers (not shown) that shift charge packets from a row of pixels 102 one row at a time into low voltage horizontal CCD (HCCD) shift register 105. Low voltage HCCD shift register 105 serially shifts the charge packets into a high voltage charge multiplying HCCD shift register 110. Charge multiplication occurs in charge multiplying HCCD shift register 110 through the application of large electric fields to the gate electrodes (not shown) overlying HCCD shift register 110 during charge transfer. The large electric fields produce a signal larger than originally collected in the pixels in pixel array 100. The large electric fields are created by overdriving the gate electrodes over the extended HCCD shift register 110 with sufficiently larger voltages. Typically, charge multiplying HCCD shift register 110 can multiply the number of charge carriers in each charge packet by a factor of two to one thousand. The multiplied charge packet output at the end of charge multiplying HCCD shift register 110 is sensed and converted into a voltage signal by output amplifier 120.

A conventional output amplifier can have a minimum noise level of eight charge carriers, meaning the output amplifier is unable to detect a signal when a charge packet contains less than eight charge carriers. One advantage of a multiplying HCCD shift register 110 is the ability to amplify or multiple charge packets that would not normally be detected by an output amplifier. For example, a charge multiplying HCCD shift register can take an input of just one undetectable charge carrier (e.g., electron) and convert it to a larger detectable group of one thousand charge carriers. The output amplifier is now able to detect the charge packet and convert the charge packet to a voltage signal.

One drawback to a charge multiplying HCCD shift register is its dynamic range. If the charge packet entering the multiplying HCCD shift register has two hundred charge carriers and if the gain is one thousand, the two hundred charge carriers are multiplied to 200,000 charge carriers. Many charge multiplying HCCD shift registers are unable to hold 200,000 or more charge carriers, and the charge carriers bloom (spread out) into the pixels adjacent to the HCCD shift register. When the capacity of the charge multiplying HCCD shift register is 200,000 charge carriers and the gain is one thousand, the maximum signal that can be measured by a charge multiplying HCCD shift register is 200 charge carriers with a noise floor of one charge carrier. That is a dynamic range of 200 to 1. To illustrate how poor that dynamic range is, an output amplifier with a minimum noise level of eight electrons can easily measure charge packets containing 32,000 charge carriers for a dynamic range of 4000 to 1.

To overcome this limitation, prior art CCD image sensors (see FIG. 2) have added a second output amplifier 200 to HCCD shift register 105. If the image is known to contain charge packets too large for the charge multiplying HCCD shift register 110, the charge packets are serially shifted through HCCD shift register 105 to output amplifier 200 instead of towards the charge multiplying HCCD shift register 110. One disadvantage to this implementation is the entire image must be read out of either output amplifier 200 or output amplifier 120. If an image contains both bright and dark regions, the image must be read out of output amplifier 200 so the bright regions do not bloom (flood) the charge multiplying HCCD shift register 110. But when the entire image is read out of output amplifier 200, dark regions in the image are not shifted through the charge multiplying HCCD shift register and do not receive the benefit of charge multiplying HCCD shift register 110.

SUMMARY

An image sensor includes a horizontal shift register electrically connected to a pixel array for receiving charge packets from the pixel array. A non-destructive sense node is connected to an output of the horizontal shift register. A charge directing switch is electrically connected to the non-destructive sense node. The charge directing switch includes two outputs. A charge multiplying horizontal shift register is electrically connected to one output of the charge directing switch. A bypass horizontal shift register or an amplifier can be connected to the other output of the charge directing switch.

A pipeline delay horizontal shift register can be connected between the non-destructive sense node and the charge directing switch. An extended horizontal shift register can be connected between the charge directing switch and the input of the charge multiplying horizontal shift register. Amplifiers can be connected to the non-destructive sense node, the output of the bypass horizontal shift register, and the output of the charge multiplying shift register.

The image sensor can be included in an image capture device. The image capture device can include correlated double sampling (CDS) units connected to the outputs of the amplifiers. The CDS units can each include an analog-to-digital converter. A computing device receives a digital pixel signal produced by the non-destructive sense node for each charge packet-output from the horizontal shift register. The computing device produces a switch signal that is received by the charge directing switch and causes the charge directing switch to direct a charge packet to the charge multiplying horizontal shift register when the number of charge carriers in the charge packet will not saturate the charge multiplying horizontal shift register. The charge directing switch directs a charge packet to the bypass horizontal shift register or amplifier connected to the other output of the charge directing switch when the charge packet will saturate the charge multiplying horizontal shift register.

The amplifier connected to the non-destructive sense node and the CDS unit connected to the amplifier combined form a charge sensing output channel having a combined charge to voltage conversion gain value G1. The amplifier electrically connected to one output of the charge directing switch and the CDS unit connected to the amplifier combined form a charge bypass output channel having a combined charge to voltage conversion gain value G2. The amplifier connected to the output of the charge multiplying horizontal shift register and the CDS unit connected to the amplifier combined form a charge multiplying output channel having a combined charge to voltage conversion gain value G3. A method for producing an image includes selecting a pixel signal produced by either the charge sensing output channel, the charge multiplying output channel or the charge bypass output channel. If the pixel signal produced by the charge sensing output channel is selected, applying a gain factor (G3/G1) to each pixel signal selected from the charge bypass output channel. If the pixel signal produced by the charge bypass output channel is selected, applying a gain factor (G3/G2) to each pixel signal selected from the charge bypass output channel. The image is produced by combining the selected pixel signals.

A method for producing an image sensor includes providing a horizontal shift register electrically connected to a pixel array for receiving charge packets from the pixel array. A non-destructive sense node is provided that is connected to an output of the horizontal shift register. A charge directing switch is provided that is electrically connected to the non-destructive sense node. The charge directing switch includes first and second outputs. A charge multiplying horizontal shift register is provided that is electrically connected to the first output of the charge directing switch. A bypass horizontal shift register or an amplifier is provided that is connected to the second output of the charge directing switch. A method for producing an image capture device further includes providing a computing device that is electrically connected to the charge directing switch, where the computing device is operable to transmit a switch signal to the charge directing switch in response to a signal received from the non-destructive sense node.

BRIEF DESCRIPTION OF THE DRAWINGS

Embodiments of the invention are better understood with reference to the following drawings. The elements of the drawings are not necessarily to scale relative to each other.

DETAILED DESCRIPTION

Figure 1:
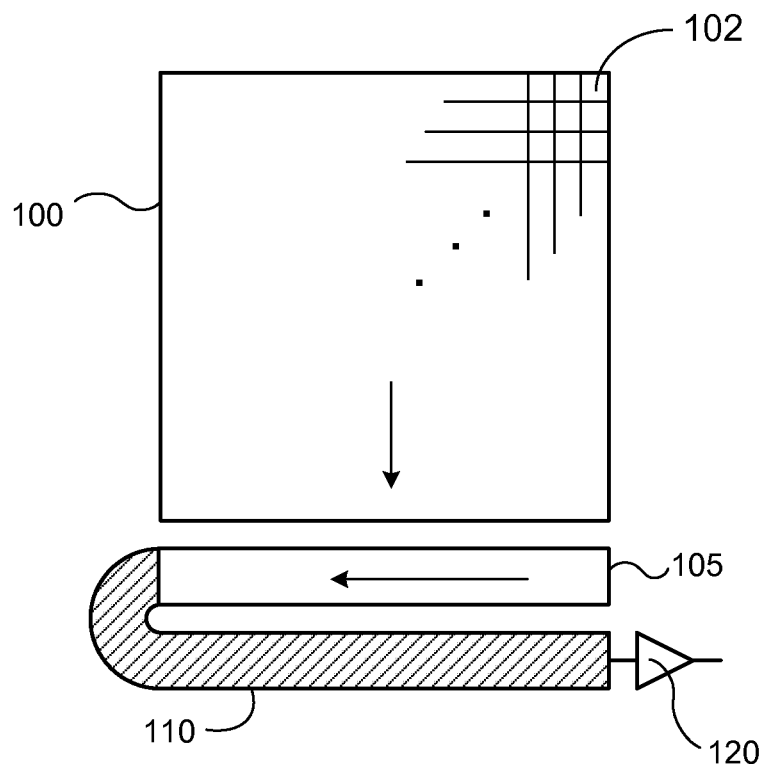
FIG. 1 depicts a simplified block diagram of a first CCD image sensor that performs charge multiplication in accordance with the prior art.
Figure 2:
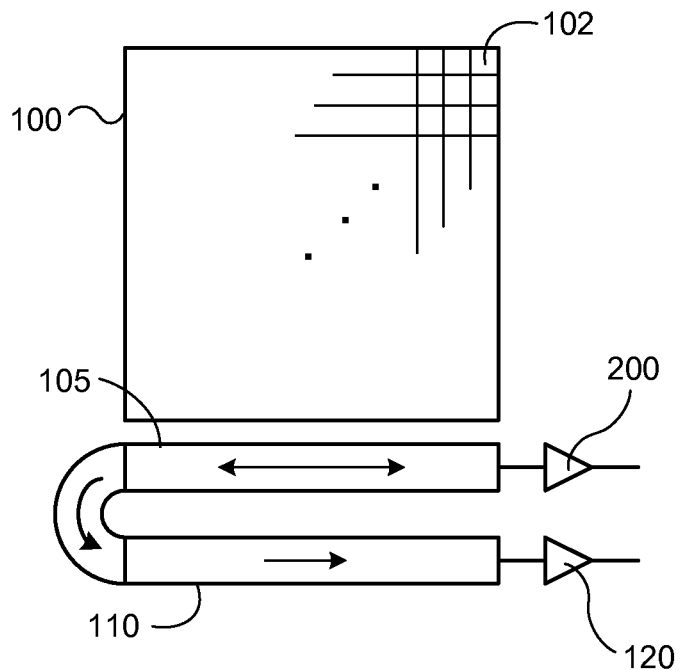
FIG. 2 depicts a simplified block diagram of a second CCD image sensor that performs charge multiplication in accordance with the prior art.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, charge, or data signal.

Additionally, the term "substrate" is to be understood as a semiconductor-based material including, but not limited to, silicon, silicon-on-insulator (SOI) technology, silicon-on-sapphire (SOS) technology, doped and undoped semiconductors, epitaxial layers or well regions formed on a semiconductor substrate, and other semiconductor structures.

Referring to the drawings, like numbers indicate like parts throughout the views.

Figure 3:
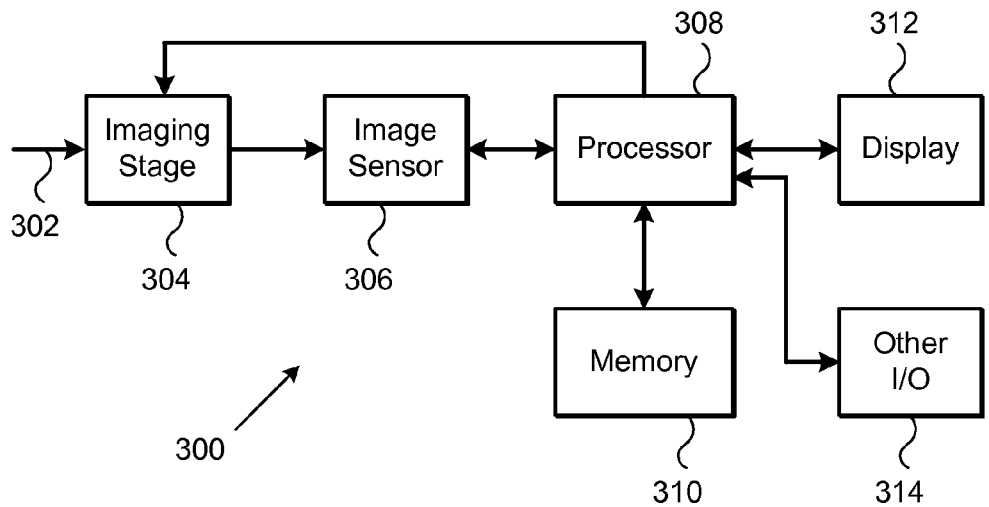
FIG. 3 is a simplified block diagram of an image capture device in an embodiment in accordance with the invention.

FIG. 3 is a simplified block diagram of an image capture device in an embodiment in accordance with the invention. Image capture device 300 is implemented as a digital camera in FIG. 3. Those skilled in the art will recognize that a digital camera is only one example of an image capture device that can utilize an image sensor incorporating the present invention. Other types of image capture devices, such as, for example, cell phone cameras and digital video camcorders, can be used with the present invention.

In digital camera 300, light 302 from a subject scene is input to an imaging stage 304. Imaging stage 304 can include conventional elements such as a lens, a neutral density filter, an iris and a shutter. Light 302 is focused by imaging stage 304 to form an image on image sensor 306. Image sensor 306 captures one or more images by converting the incident light into electrical signals. Digital camera 300 further includes processor 308, memory 310, display 312, and one or more additional input/output (I/O) elements 314. Although shown as separate elements in the embodiment of FIG. 3, imaging stage 304 may be integrated with image sensor 306, and possibly one or more additional elements of digital camera 300, to form a compact camera module.

Processor 308 may be implemented, for example, as a microprocessor, a central processing unit (CPU), an application-specific integrated circuit (ASIC), a digital signal processor (DSP), or other processing device, or combinations of multiple such devices. Various elements of imaging stage 304 and image sensor 306 may be controlled by timing signals or other signals supplied from processor 308.

Memory 310 may be configured as any type of memory, such as, for example, random access memory (RAM), read-only memory (ROM), Flash memory, disk-based memory, removable memory, or other types of storage elements, in any combination. A given image captured by image sensor 306 may be stored by processor 308 in memory 310 and presented on display 312. Display 312 is typically an active matrix color liquid crystal display (LCD), although other types of displays may be used. The additional I/O elements 314 may include, for example, various on-screen controls, buttons or other user interfaces, network interfaces, or memory card interfaces.

It is to be appreciated that the digital camera shown in FIG. 3 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 4:
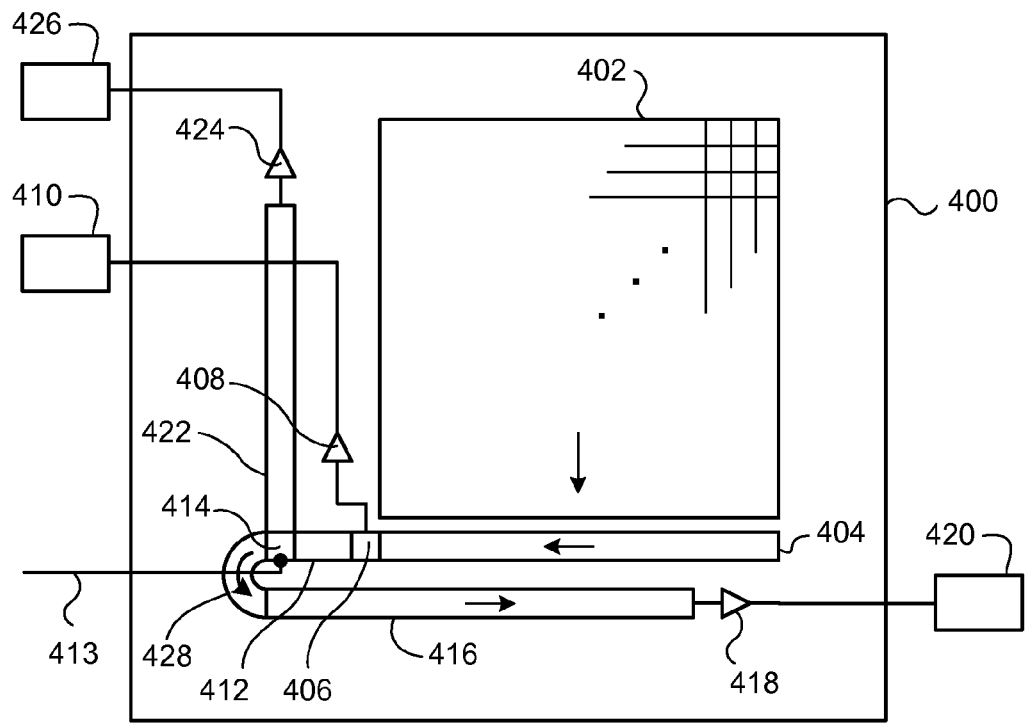
FIG. 4 is a simplified block diagram of a first CCD image sensor suitable for use as image sensor 306 shown in FIG. 3 in an embodiment in accordance with the invention.

Referring now to FIG. 4, there is shown a simplified block diagram of a first CCD image sensor suitable for use as image sensor 306 shown in FIG. 3 in an embodiment in accordance with the invention. Image sensor 400 can be implemented as any type of CCD image sensor, including, but not limited to, an interline CCD image sensor and full frame image sensor.

Image sensor 400 includes pixel array 402 having vertical shift registers (not shown) that shift charge packets from each row of pixels into horizontal shift register 404. Horizontal shift register 404 is implemented as a low voltage horizontal charge-coupled device (CCD) shift register in an embodiment in accordance with the invention. Horizontal shift register 404 serially shifts each charge packet towards non-destructive sense node 406. Non-destructive sense node 406 is implemented as a non-destructive floating gate sense node in an embodiment in accordance with the invention.

The voltage on non-destructive sense node 406 is input into amplifier 408. The output of output amplifier 408 is connected to output circuit 410. Output amplifier 408 and output circuit 410 together form a "charge sensing output channel". Output circuit 410 is implemented as a correlated double sampling (CDS) unit in an embodiment in accordance with the invention. The CDS unit can be configured in any one of various circuit implementations. By way of example only, a CDS unit can be configured to subtract the double samples (e.g., reset and image samples) in the analog domain and pass the result to an analog-to-digital converter. As another example, a CDS unit that is available from Analog Devices, part number AD9824, can be used for a CDS unit. The CDS unit may also be configured to digitally convert both samples and subtract the double samples in the digital domain as in U.S. Pat. No. 5,086,344.

Typically, an output circuit that includes an analog-to-digital converter has a pipeline processing delay. When the output circuit receives an analog pixel signal that is output from output amplifier 408, the corresponding digital pixel signal is not output from output circuit 410 until a given number of clock cycles have passed. A pipeline delay horizontal shift register is used in some embodiments in accordance with the invention to compensate for the pipeline processing delay of output circuit 410. In the illustrated embodiment, pipeline delay horizontal shift register 412 has a length that corresponds to the pipeline processing delay of output circuit 410. The length of pipeline delay horizontal shift register 412 is determined so that a charge packet that is sensed by non-destructive sense node 406 and passed to pipeline delay horizontal shift register 412 is output from pipeline delay horizontal shift register 412 and arrives at charge directing switch 414 at substantially the same time or later as the digitized pixel signal is output from CDS unit 410. Pipeline delay horizontal shift register 412 can have different lengths or not be used in other embodiments in accordance with the invention.

A computing device (e.g., processor 308 in FIG. 3) analyzes the digital pixel signal output from output circuit 410 and transmits a switch signal on signal line 413 to charge directing switch 414. The computing device is constructed external to the image sensor die or chip in an embodiment in accordance with the invention. The computing device can be constructed on the image sensor die or chip in another embodiment in accordance with the invention.

If the digital pixel signal output from output circuit 410 represents a small amount or number of charge carriers, the switch signal on signal line 413 causes charge directing switch 414 to pass the charge packet onto charge multiplication horizontal shift register 416. The charge packet is then shifted through charge multiplying horizontal shift register 416 and input into output amplifier 418. Output amplifier 418 outputs an analog pixel signal representing the amount of charge carriers in the charge packet.

Output circuit 420 is connected to an output of output amplifier 418. Output amplifier 418 and output circuit 420 together form a "charge multiplying output channel". Output circuit 420 converts the analog pixel signal into a digital pixel signal. Output circuit 420 can perform additional processing of the pixel signal in some embodiments in accordance with the invention. Output circuit 420 is implemented as a CDS unit in an embodiment in accordance with the invention. The CDS unit can be configured in any one of multiple implementations.

If the digital pixel signal output from output circuit 410 represents a number of charge carriers that can saturate multiplying horizontal shift register 416, the switch signal on signal line 413 causes charge directing switch 414 to direct the charge packet to non-charge multiplying bypass horizontal shift register 422. The charge packet is then shifted through bypass horizontal shift register 422 and input into output amplifier 424. Output amplifier 424 outputs an analog voltage signal representing the amount of charge carriers in the charge packet.

Output circuit 426 is connected to an output of output amplifier 424. Output amplifier 424 and output circuit 426 together form a "charge bypass output channel". Output circuit 426 converts the analog pixel signal into a digital pixel signal. Output circuit 426 can perform additional processing of the pixel signal in some embodiments in accordance with the invention. Output circuit 426 is implemented as a CDS unit in an embodiment in accordance with the invention. The CDS unit can be configured in any one of multiple implementations.

Extended horizontal shift register 428 serves as a connecting horizontal shift register between charge directing switch 414 and charge multiplying horizontal shift register 416. Extended horizontal shift register 428 operates at low voltage levels in an embodiment in accordance with the invention. Extended horizontal shift register 428 can be omitted in other embodiments in accordance with the invention.

Image sensor 400 produces two pixel signals for each charge packet read out of pixel array 402. One pixel signal is produced by the charge sensing output channel for each charge packet. When the charge packet is directed to the charge bypass output channel, the second pixel signal is produced by the charge bypass output channel. When the charge packet is directed to the charge multiplying output channel, the second pixel signal is produced by the charge multiplying output channel.

The lengths of bypass horizontal shift register and charge multiplying horizontal shift register are designed and implemented such that a charge packet arrives at the output amplifier 424 or the output amplifier 418 on the same horizontal clock cycle in an embodiment in accordance with the invention. The computing device constructs the final image by taking the output of output amplifier 424 or of output amplifier 418 based on how the computing device directs each charge packet at the charge directing switch.

Bypass horizontal shift register can be longer or shorter than charge multiplying horizontal shift register in other embodiments in accordance with the invention. In these embodiments, the digital pixel signals output from output circuits 426 and 420 can be synchronized or re-ordered by the computing device (e.g., processor 308 in FIG. 3). The computing device can store the state of the switch signal for each charge packet and use that data to re-order the digital pixels signals to reproduce the image.

Output circuits 410, 420, 426 are constructed external to the image sensor die or chip in an embodiment in accordance with the invention. Some or all of the components in output circuit 410, output circuit 420, or output circuit 426 can be constructed on the image sensor die or chip in other embodiments in accordance with the invention.

Figure 5:
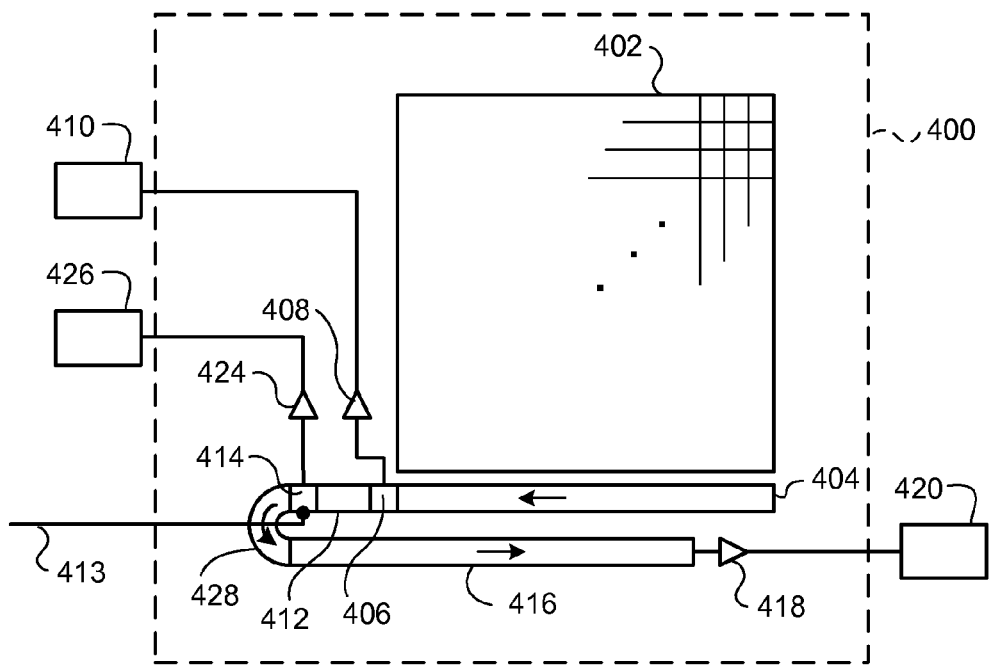
FIG. 5 is a simplified block diagram of a second CCD image sensor suitable for use as image sensor 306 shown in FIG. 3 in an embodiment in accordance with the invention.

FIG. 5 is a simplified block diagram of a second CCD image sensor suitable for use as image sensor 306 shown in FIG. 3 in an embodiment in accordance with the invention. Image sensor 500 includes many of the same elements as image sensor 400 shown in FIG. 4, with the exception of bypass horizontal shift register 422. Bypass horizontal shift register 422 is omitted from image sensor 500 and the input to amplifier 424 is connected to charge directing switch 414.

One advantage to the FIG. 5 embodiment is that power is no longer needed to operate the bypass horizontal shift register. Power consumption is reduced in the image sensor 500 compared to image sensor 400 shown in FIG. 4.

Figure 6:
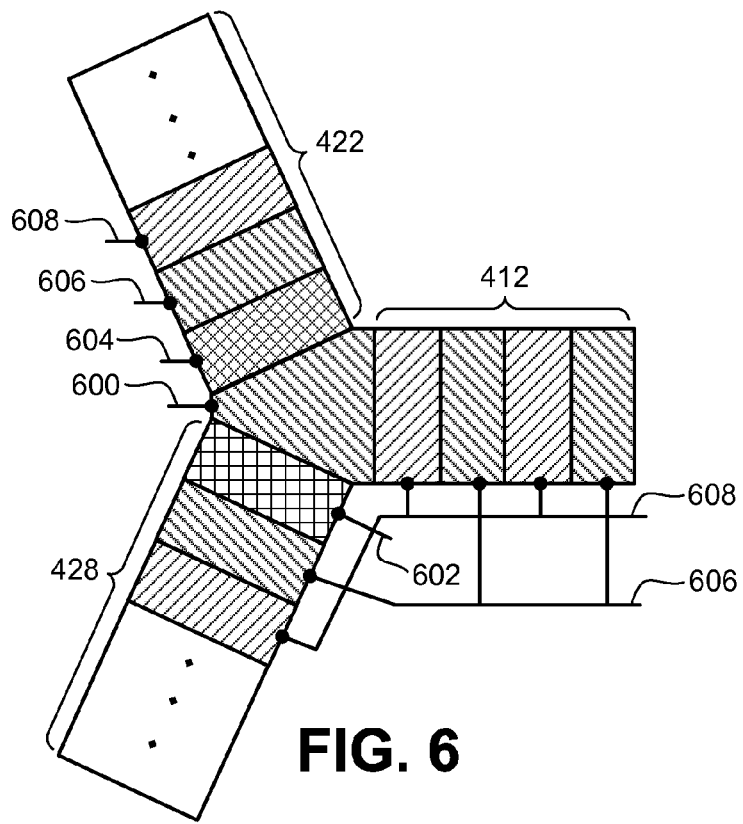
FIG. 6 depicts a simplified top view of charge directing switch 414 shown in FIG. 4 in an embodiment in accordance with the invention.

Referring now to FIG. 6, there is shown a simplified top view of charge directing switch 414 shown in FIG. 4 in an embodiment in accordance with the invention. Pipeline delay horizontal shift register 412, bypass horizontal shift register 422, and extended horizontal shift register 428 are shown connected to charge directing switch 414. Charge directing switch 414 includes gates 600, 602, 604 that are disposed over charge shift elements in an embodiment in accordance. Charge directing switch 414 includes two outputs, one output is associated with gate 602 and the other output is associated with gate 604.

Pipeline delay horizontal shift register 412, bypass horizontal shift register 422, and extended horizontal shift register 428 are each depicted as two phase CCD shift registers in the illustrated embodiment. Other embodiments in accordance with the invention are not limited to two phase CCD shift registers. CCD shift registers having three or more phases can be implemented in other embodiments.

Figure 7:
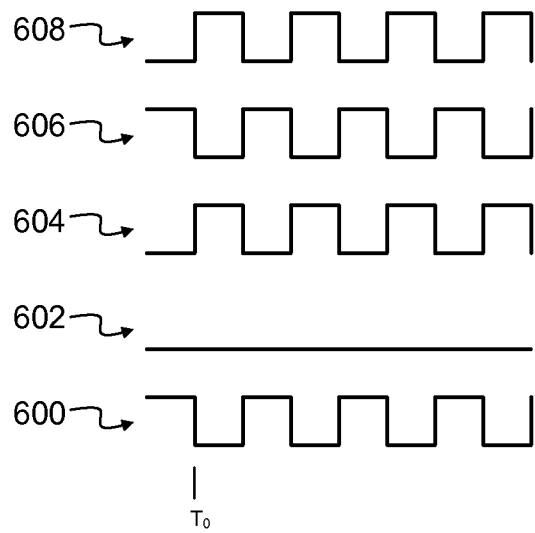
FIG. 7 depicts an exemplary timing diagram for charge directing switch 414 shown in FIGS. 4 and 5.

The exemplary timing diagram illustrated in FIG. 7 is used to direct charge from pipeline delay horizontal shift register 412 to bypass horizontal shift register 422 in an embodiment in accordance with the invention. In embodiments that omit pipeline delay horizontal shift register 412, the timing diagram can be used to direct charge from non-destructive sense node 406 to bypass horizontal shift register 422. When gate 600 is clocked to a given level (e.g., a low level) at time $T_0$, the signal on gate 602 is held at the low level and the signal on gate 604 is clocked to a high level. When the signals on gates 600 and 602 are at the low level and the signal on gate 604 is at the high level, charge flows out of the charge shift element disposed under gate 600 and into the charge shift element under gate 604. The signals applied to the gates 606, 608 in bypass horizontal shift register 422/502 are then clocked as shown in FIG. 7 to shift the charge packets through the bypass horizontal shift register 422.

Figure 8:
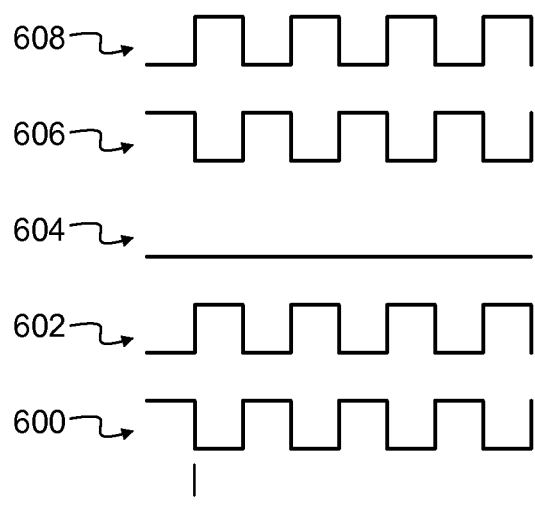
FIG. 8 illustrates an exemplary timing diagram for charge directing switch 414 shown in FIGS. 4 and 5.

The exemplary timing diagram depicted in FIG. 8 is used to direct charge from pipeline delay horizontal shift register 412 to extended horizontal shift register 428. In embodiments that omit extended horizontal shift register 428, the timing diagram can be used to direct charge from pipeline delay horizontal shift register 412 to charge multiplying horizontal shift register 416. And finally, in embodiments that omit pipeline delay horizontal shift register 412, the timing diagram can be used to direct charge from non-destructive sense node 406 to either extended horizontal shift register 428 or charge multiplying horizontal shift register 416.

At time $T_{00}$, gate 600 is clocked to a low level while the signal on gate 604 is held at the low level and the signal on gate 602 is clocked to a high level. When the signals on gates 600 and 604 are at the low level and the signal on gate 602 is at the high level, charge flows out of the charge shift element under gate 600 and into the charge shift element below gate 602. The signals applied to the gates 606, 608 in extended horizontal shift register 428 are then clocked as shown in FIG. 8 to shift the charge packets through the extended horizontal shift register. The charge directing switch illustrated in FIG. 6 can also be used in the embodiment shown in FIG. 5. Amplifier 424 is connected to the charge shift element under gate 604. The timing diagrams depicted in FIGS. 7 and 8 can be used to direct charge packets to amplifier 424 or charge multiplying horizontal shift register 416, respectively.

Figure 9:
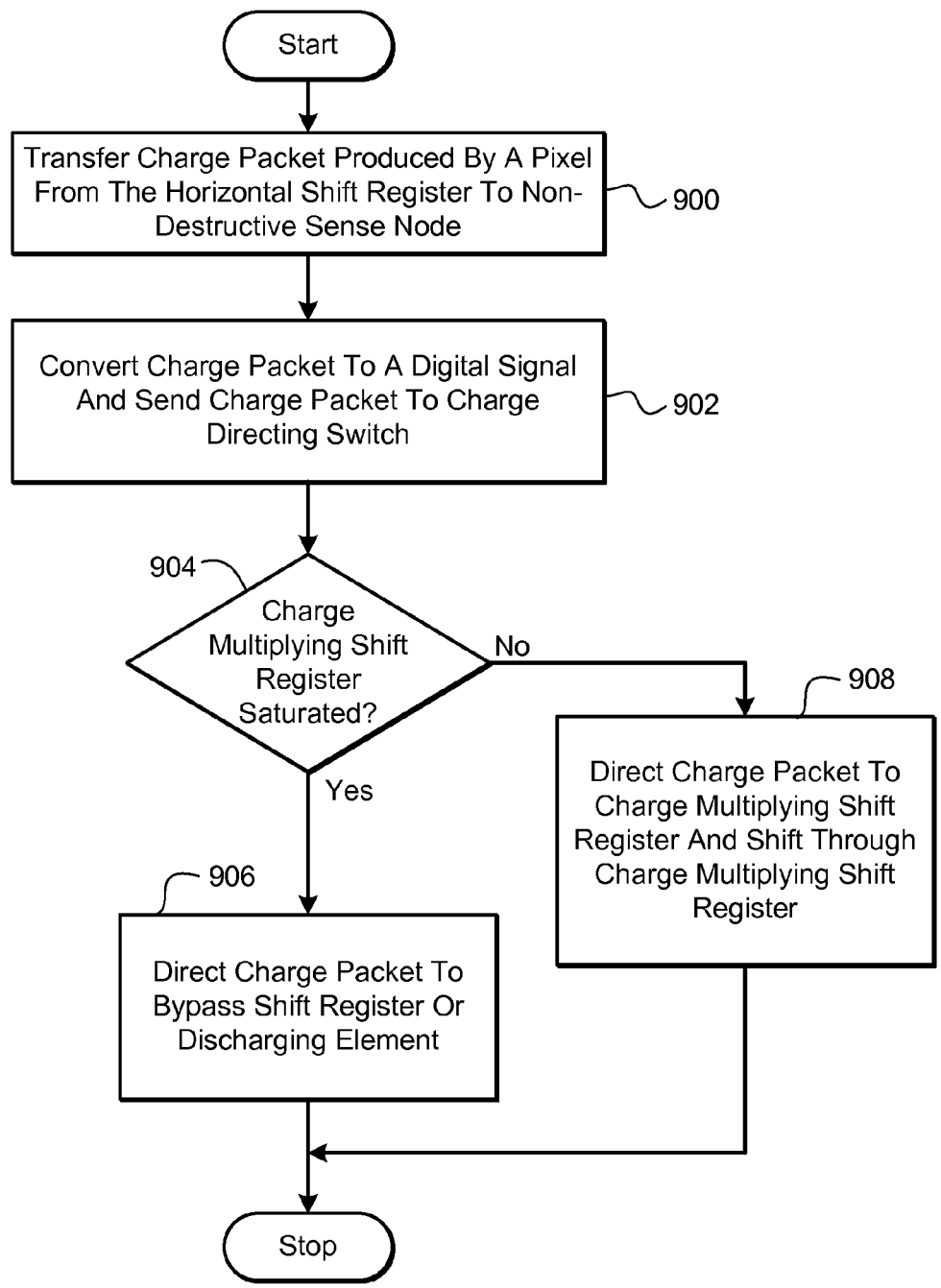
FIG. 9 is a flowchart of a method for operating an image sensor in an embodiment in accordance with the invention.

Referring now to FIG. 9, there is shown a flowchart of a method for controlling the flow of charge packets in an embodiment in accordance with the invention. Initially, a charge packet is shifted to the non-destructive sense node at block 900. The charge packet is converted to a digital pixel signal representing the amount or number of charge carriers in the charge packet while the charge packet is sent to the charge directing switch (block 902). The charge packet is shifted through a pipeline delay horizontal shift register to send the charge packet to the charge directing switch in an embodiment in accordance with the invention.

A determination is then made at block 904 as to whether or not the number of charge carriers in the charge packet will saturate the charge multiplying horizontal shift register. If the charge packet will saturate the charge multiplying horizontal shift register, the process passes to block 906 where the charge packet is directed to either the bypass horizontal shift register (FIG. 4) or the discharging element (FIG. 5). If the charge carriers will not saturate the charge multiplying horizontal shift register, the charge packet is directed to the charge multiplying horizontal shift register and shifted through the charge multiplying horizontal shift register (block 908).

The method depicted in FIG. 9 repeats for each pixel read out of the pixel array. Only charge packets that do not cause blooming are input and shifted through the charge multiplying horizontal shift register. Larger charge packets that cause blooming are directed to the bypass horizontal shift register (FIG. 4) or the discharging element (FIG. 5). In image sensors that include the charge bypass output channel, the output amplifier connected to the bypass horizontal shift register (i.e., output amplifier 424) has a noise floor that is higher than the noise floor of output amplifier connected to the charge multiplying horizontal shift register (i.e., output amplifier 418) in an embodiment in accordance with the invention. The higher noise floor is not significant because it is less than the photon shot noise contained within the large pixel value. By way of example only, the output amplifier 424 can have a charge to voltage conversion gain as high as possible to allow the output amplifier 424 to read small signals with less than N2 electrons noise. With N2 electrons noise, any signal of $N2^2$ electrons or more (the photon shot noise is the square root of the signal) would have more than N2 electrons of photon shot noise. The signal level that causes a charge packet to be directed to the bypass horizontal shift register 422 can be two to three times $N2^2$ electrons. In this example, the charge multiplying horizontal shift register 416 is not used and the charge directing switch directs all of the charge packets with more than $3 \times N2^2$ electrons to the output amplifier 424. Because the output amplifier 424 may have a large charge conversion gain, the output amplifier 424 can saturate if the signal contains too much signal. In that case, the output amplifier 408 is used because the output amplifier 408 has a gain that is less than the gain of the output amplifier 424.

Figure 10:
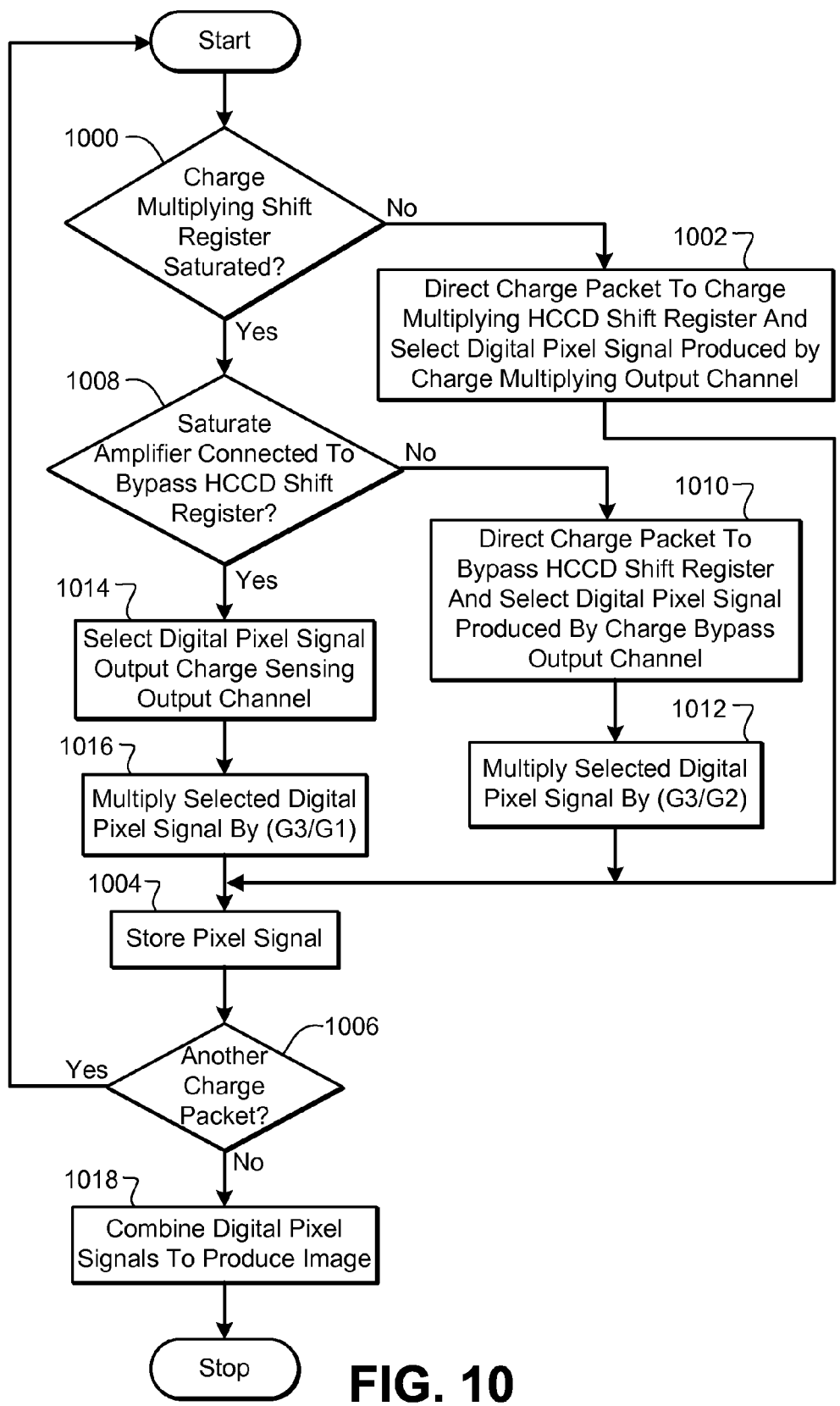
FIG. 10 is a flowchart of a method for producing an image that can be used with the embodiment shown in FIGS. 4 and 5.

FIG. 10 is a flowchart of a method for producing an image that can be used with the embodiment shown in FIGS. 4 and 5. The value G1 represents the combined charge to voltage conversion gain of the amplifier 408 and output circuit 410. The value G2 represents the combined charge to voltage conversion gain of the output amplifier 424 and output circuit 426. And finally, the value G3 represents the combined charge to voltage conversion gain of the output amplifier 418 and output circuit 420.

Initially, a determination is made at block 1000 as to whether or not the number of charge carriers in a charge packet will saturate the charge multiplying horizontal shift register. If not, the charge packet is directed to and shifted through the charge multiplying horizontal shift register and the digital pixel signal produced by the output amplifier and output circuit connected to the charge multiplying horizontal shift register is selected as the digital pixel signal (block 1002). The digital pixel signal is then stored, as shown in block 1004. By way of example only, the digital pixel signal can be stored in memory 310 shown in FIG. 3.

Next, as shown in block 1006, a determination is made as to whether or not another charge packet is to be produced by the image sensor. If so, the method returns to block 1000. When the number of charge carriers in the charge packet will saturate the charge multiplying horizontal shift register (block 1000), the process passes to block 1008 where a determination is made as to whether or not the number of charge carriers will saturate the output amplifier connected to the bypass horizontal shift register. If not, the charge packet is directed to and shifted through the bypass horizontal shift register and the digital pixel signal produced by the output amplifier and output circuit connected to the bypass horizontal shift register is selected as the digital pixel signal (block 1010). The selected digital pixel signal is then multiplied by the gain ratio (G3/G2) at block 1012 and the modified digital pixel signal stored at block 1004.

If the number of charge carriers will saturate the output amplifier connected to the bypass horizontal shift register at block 1006, the digital pixel signal produced by the amplifier connected to the non-destructive sense node is selected as the digital pixel signal (block 1014). The selected digital pixel signal is then multiplied by the gain ratio (G3/G1) at block 1016 and the modified pixel signal stored at block 1004. By way of example only, the gain ratios (G3/G2) and (G3/G1) can be applied to the selected digital pixel signals by a computing device, such as processor 308 shown in FIG. 3.

When all of the charge packets are produced by the image sensor at block 1006, the method passes to block 1018 where the stored pixel signals or modified pixel signals are combined to produce an image. Embodiments in accordance with the invention can combine blocks 1004 and 1018 such that the pixel signals are stored in a location that corresponds to the location of the pixel in the image. Thus, the memory or storage unit stores a completed image when all of the charge packets have been produced by the image sensor.

One process for determining the gain ratios G3/G2 and G3/G1 used in the method shown in FIG. 10 will now be described. The G3/G1 gain ratio can be determined from the charge packets that are directed to the charge multiplying horizontal shift register 418 and output circuit 420. Those charge packets are processed by both output circuits 410 and 420. In one embodiment in accordance with the invention, a running average of (the digital pixel signals produced by output circuit 420)/(the digital pixel signals produced by output circuit 410) is determined. This running average equals the gain ratio G3/G1. A running average is used in an embodiment because as the camera temperature changes the gain ratio G3/G1 will likely also change.

The G3/G2 gain ratio is determined by first measuring the gain ratio G1/G2 and then calculating $G3/G2 = G3/G1 \times G1/G2$. The G1/G2 gain ratio can be determined from the charge packets that are directed to bypass horizontal shift register 422 and output circuit 426. Those charge packets are processed by both output circuits 410 and 426. A running average of (the digital pixel signals produced by output circuit 410)/ (the digital pixel signals produced by output circuit 426) is determined.

Embodiments in accordance with the invention are not limited to the use of a running average. A running least squares fit average can be used in another embodiment in accordance with the invention. Those skilled in the art will appreciate that the running least squares fit average will also correct offset errors.

Figure 11:
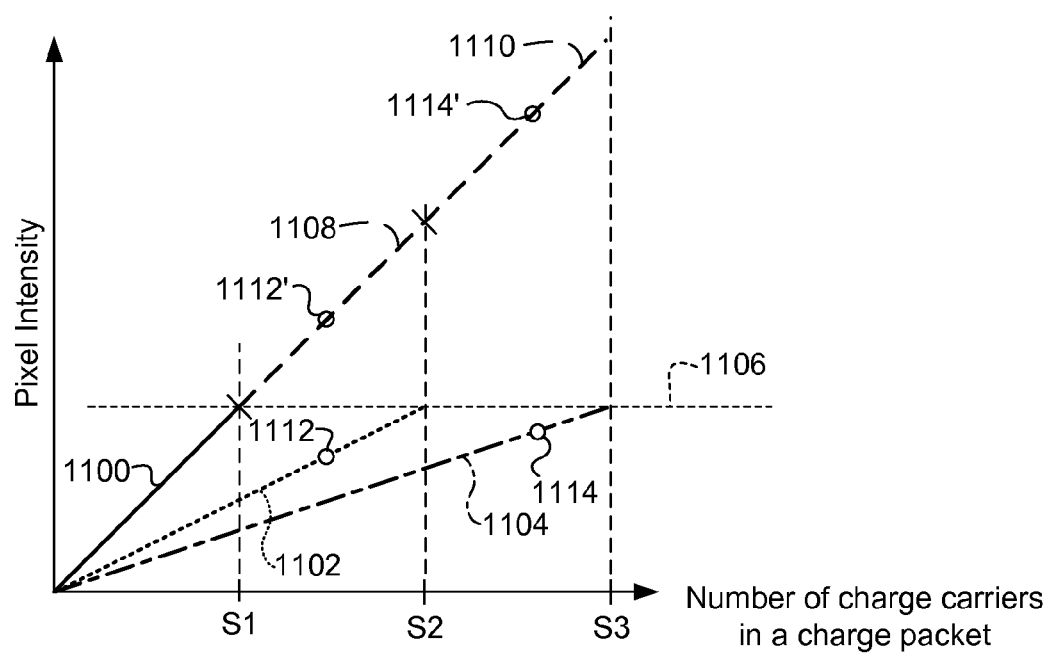
FIG. 11 is an exemplary diagram that is used to illustrate how the signals output from the three output channels are combined to produce an image in an embodiment in accordance with the invention.

FIG. 11 is an exemplary diagram that is used to illustrate how the signals output from the three output channels are combined to produce an image in an embodiment in accordance with the invention. Line 1100 represents the output of the charge multiplying output channel for charge packets having zero to S1 number of charge carriers. Line 1102 represents the output of the charge bypass output channel for charge packets having zero to S2 number of charge carriers. And finally, line 1104 represents the output of the charge sensing output channel for charge packets having zero to S3 number of charge carriers. The slope of each line 1100, 1102, 1104 is the output gains G3, G2, and G1, respectively.

Line 1106 represents a saturation level for the amplifiers in the different output channels (e.g., amplifiers 408, 418, 426). The pixel intensity for all output channels will not exceed this saturation level. Thus, the maximum pixel intensity for an image is limited to the intensity level represented by line 1106. Output amplifier 418 saturates at the lowest number of charge carriers S1, output amplifier 424 at the number of charge carriers S2, and output amplifier 408 at the highest number of charge carriers S3 in the illustrated embodiment. If the number of charge carriers is between S1 and S2, the output of the charge bypass output channel is multiplied by the ratio of the slopes of the output lines 1100, 1102 (i.e., the gain ratio). If the number of charge carriers is greater than S2, the output of the charge sensing output channel is multiplied by the ratio of the slopes of lines 1104 and 1100.

The pixel signals output from some of the output channels are multiplied by a gain ratio to produce an image having a greater range of intensity values. The gain ratios, when applied to the charge packets having a number of charge carriers between S1 and S3, modify the pixel intensity values such that the intensity values fall along lines 1108 and 1110. Line 1108 is between S1 and S2 and line 1110 between S2 and S3.

By way of example only, a charge packet is output from the charge bypass output channel having a number of charge carriers that corresponds to point 1112 along line 1102. When the charge packet is multiplied by the gain ratio (G3/G2), the modified pixel intensity value corresponds to point 1112' along line 1108. A charge packet output from the charge sensing output channel has a number of charge carriers corresponding to point 1114 along line 1104. When the charge packet is multiplied by the gain ratio (G3/G1), the modified pixel intensity value corresponds to point 1114' along line 1110. Thus, the gain ratios produce modified pixel intensities that fall or substantially fall on lines 1108 and 1110, thereby producing an image with a greater range of pixel intensity values.

Figure 12:
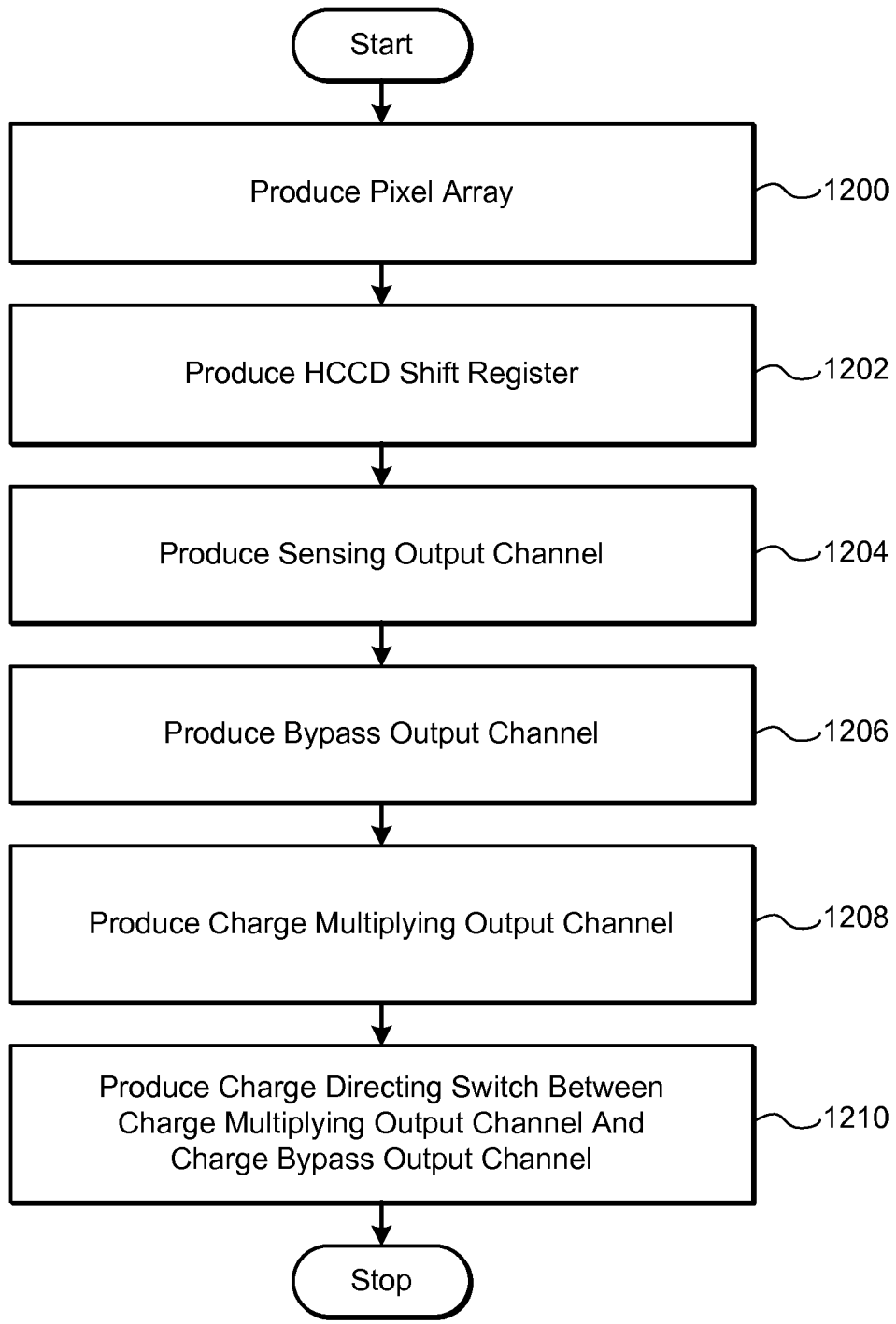
FIG. 12 is a flowchart of a method for producing an image sensor in an embodiment in accordance with the invention.

Referring now to FIG. 12, there is shown a flowchart of a method for producing an image sensor in an embodiment in accordance with the invention. Initially, a pixel array is produced, as shown in block 1200. The pixel array of photodetectors can be produced using techniques known in the art. For example, masking layers can be deposited over a substrate and each patterned to provide openings at the locations where respective components in each pixel (e.g., photodetectors) will be formed. Dopants having particular conductivity types are then implanted into the substrate to produce the components.

Next, as shown in block 1202, a horizontal CCD shift register is produced on one side of the pixel array. The horizontal CCD shift register can be produced using techniques known in the art. For example, a masking layer can be deposited over the substrate and patterned to provide openings at the locations where each shift register element, or phase in each shift register element, will be formed. A dopant having a particular conductivity type is then implanted into the substrate to produce the shift register element or phase. Barrier implants may also be formed between shift register elements or phases. Also, electrodes are produced over each shift register element or phase and electrically connected to respective voltage clocking signals that are used to shift charge packets through the horizontal CCD shift registers. Typically, the electrodes are formed in electrode layers. In a two phase CCD shift register, alternating electrodes (every other electrode) form one electrode layer and the remaining electrodes a second electrode layer. In a four phase CCD shift register, electrodes disposed over the first and third phase (or the second and fourth phase) form one electrode layer and the remaining electrodes a second electrode layer.

Next, as shown in blocks 1204, 1206, and 1208, the charge sensing output channel, the charge bypass output channel, and the charge multiplying output channel are produced. The output channels can be produced using techniques known in the art. For example, a masking layer can be deposited over the substrate and patterned to provide openings at the locations where each shift register element, or phase in each shift register element, will be formed. A dopant having a particular conductivity type is then implanted into the substrate to produce the shift register element or phase. Barrier implants may also be formed between shift register elements or phases. Also, electrodes or gates are produced over each shift register element or phase and electrically connected to respective voltage clocking signals that are used to shift charge packets through the horizontal shift registers. Typically, the gates are formed in layers. In a two phase shift register, alternating gates (every other gate) form one layer and the remaining gates a second electrode layer. In a four phase shift register, gates disposed over the first and third phase (or the second and fourth phase) form one layer and the remaining gates a second electrode layer.

And finally, the charge directing switch is produced at block 1210. The charge directing switch can be produced using techniques known in the art. For example, a masking layer can be deposited over the substrate and patterned to provide openings at the locations where each shift register element, or phase in each shift register element, will be formed. A dopant having a particular conductivity type is then implanted into the substrate to produce the shift register element or phase. Barrier implants may also be formed between shift register elements or phases. Also, the gates are produced over each shift register element or phase and electrically connected to respective voltage clocking signals that are used to direct the charge packets through a respective output of the charge directing switch.

Those skilled in the art will recognize that other embodiments in accordance with the invention can modify the order of the blocks shown in FIG. 12. For example, in embodiments that do not include a charge bypass output channel, the discharging element can be produced using techniques known in the art. Multiple components included in the pixel array, horizontal shift register, charge bypass output channel, charge sensing output channel, or the charge multiplying output channel can be produced at the same time by patterning the masking layers appropriately. Embodiments that include a pipeline delay horizontal shift register or an extended horizontal shift register can produce these elements when producing the desired output channels. Additionally, other components in an image sensor can be produced in between the processes shown in FIG. 12.

The invention has been described in detail with particular reference to certain embodiments thereof, but it will be understood that variations and modifications can be effected within the spirit and scope of the invention. For example, signal levels other than the signal levels shown in FIGS. 7, 8 and 10 can be used. The charge directing switch can be implemented differently in other embodiments in accordance with the invention. An image capture device can include additional components than the components shown in FIG. 3.

And even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

| PARTS LIST | |
|---|---|
| 100 | pixel array |
| 102 | pixel |
| 105 | horizontal CCD shift register |
| 110 | charge multiplying horizontal CCD shift register |
| 120 | output amplifier |
| 200 | output amplifier |
| 300 | image capture device |
| 302 | light |
| 304 | imaging stage |
| 306 | image sensor |
| 308 | processor |
| 310 | memory |
| 312 | display |
| 314 | other input/output (I/O) |
| 400 | image sensor |
| 402 | pixel array |
| 404 | horizontal shift register |

-continued

PARTS LIST

| | |
|---|---|
| 406 | non-destructive sense node |
| 408 | amplifier |
| 410 | correlated double sample unit |
| 412 | pipeline delay horizontal shift register |
| 413 | signal line |
| 414 | charge directing switch |
| 416 | charge multiplying horizontal shift register |
| 418 | amplifier |
| 420 | correlated double sample unit |
| 422 | bypass horizontal shift register |
| 424 | amplifier |
| 426 | correlated double sample unit |
| 428 | extended horizontal CCD shift register |
| 600 | gate |
| 602 | gate |
| 604 | gate |
| 606 | gate |
| 608 | gate |
| 1100 | line representing output of the charge multiplying output channel |
| 1102 | line representing output of the charge bypass output channel |
| 1104 | line representing output of the charge sensing output channel |
| 1106 | line representing a saturation level |
| 1108 | line representing pixel intensity values |
| 1110 | line representing pixel intensity values |
| 1112 | pixel intensity value |
| 1112' | modified pixel intensity value |
| 1114 | pixel intensity value |
| 1114' | modified pixel intensity value |
| S1 | value representing a number of charge carriers |
| S2 | value representing a number of charge carriers |
| S3 | value representing a number of charge carriers |

The invention claimed is:

1. A method for producing an image capture device comprising:
    providing a horizontal shift register electrically connected to a pixel array for receiving charge packets from the pixel array;
    providing a non-destructive sense node connected to an output of the horizontal shift register;
    providing a charge directing switch electrically connected to the non-destructive sense node, the charge directing switch being configured to receive charge from the non-destructive sense node and supply the received charge either to a first output or a second outputs;
    providing a charge multiplying horizontal shift register electrically connected to the first output of the charge directing switch;
    providing a first amplifier electrically connected to an output of the charge multiplying horizontal shift register, the first amplifier being configured to receive charge from the charge multiplying horizontal shift register and output a voltage signal corresponding to an amount of the charge received from the charge multiplying horizontal shift register; and
    providing a second amplifier, different from the first amplifier, electrically connected to the second output of the charge directing switch, the second amplifier being configured to receive charge from the charge directing switch and output a voltage signal corresponding to an amount of the charge received from the charge directing switch.

2. The method as in claim 1, further comprising:
    providing a third amplifier connected to the non-destructive sense node, the third amplifier being configured to receive, from the non-destructive sense node, a voltage corresponding to an amount of charge sensed by the non-destructive sense node.

3. The method as in claim 1, further comprising:
    providing a first output circuit connected to an output of the first amplifier, the first output circuit comprising a first analog-to-digital converter electrically connected to the output of the first amplifier; and
    providing a second output circuit connected to an output of the second amplifier, the second output circuit comprising a second analog-to-digital converter electrically connected to the output of the second amplifier.

4. The method as in claim 1, further comprising:
    providing a bypass horizontal shift register connected between the second output of the charge directing switch and the second amplifier.

5. The method as in claim 4, wherein a length of the bypass horizontal shift register and a length of the charge multiplying horizontal shift register are substantially equal.

6. The method as in claim 3, further comprising providing a pipeline delay horizontal shift register connected between the non-destructive sense node and the charge directing switch.

7. The method as in claim 6, further comprising providing a third output circuit connected to an output of the third amplifier, the third output circuit comprising a third analog-to-digital converter electrically connected to the output of the third amplifier, wherein a length of the pipeline delay horizontal shift register is based on a pipeline delay time of the third amplifier and the third output circuit.

8. The method as in claim 1, further comprising providing an extended horizontal shift register connected between the first output of the charge directing switch and an input of the charge multiplying horizontal shift register.

9. The method as in claim 1, further comprising providing a computing device electrically connected to the charge directing switch, wherein (i) the computing device is adapted to transmit a switch signal to the charge directing switch in response to a signal received from the non-destructive sense node, (i) the signal from the non-destructive sense node corresponds to an amount of charge sensed by the non-destructive sense node, and (iii) the switch signal directs the charge directing switch to supply charge received from the non-destructive sense node to either the first or second output based on the amount of charge sensed by the non-destructive sense node.

10. The method as in claim 2, wherein the charge directing switch is configured to direct received charge, on a pixel-by-pixel basis, to the first output or the second output in response to a voltage signal output by the third amplifier.

* * * * *

UNITED STATES PATENT AND TRADEMARK OFFICE
CERTIFICATE OF CORRECTION

PATENT NO. : 8,479,374 B2
APPLICATION NO. : 12/967341
DATED : July 9, 2013
INVENTOR(S) : Christopher Parks It is certified that error appears in the above-identified patent and that said Letters Patent is hereby corrected as shown below:

In the Claims, Column 13, Line 43, Claim 1, after "a second" delete "outputs" and insert therein -- output --.

Signed and Sealed this
First Day of October, 2013

Teresa Stanek Rea
*Deputy Director of the United States Patent and Trademark Office*